(12) United States Patent
Hori et al.

(10) Patent No.: US 8,164,689 B2
(45) Date of Patent: Apr. 24, 2012

(54) SYNCHRONIZING SIGNAL CONTROL CIRCUIT AND SYNCHRONIZING SIGNAL CONTROL METHOD

(75) Inventors: Yasuhiro Hori, Tokyo (JP); Koichi Sato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 547 days.

(21) Appl. No.: 12/433,208

(22) Filed: Apr. 30, 2009

(65) Prior Publication Data

US 2009/0284654 A1 Nov. 19, 2009

(30) Foreign Application Priority Data

May 19, 2008 (JP) ................................. 2008-131292

(51) Int. Cl.
*H03L 7/00* (2006.01)

(52) U.S. Cl. ........ 348/536; 348/537; 348/547; 348/516; 348/525; 348/565; 348/521; 348/518; 348/540; 348/541; 348/522; 348/500; 348/501

(58) Field of Classification Search .................. 348/536, 348/537, 500, 501, 521, 522, 516, 518, 525, 348/540, 541, 547, 565
See application file for complete search history.

(56) References Cited

U.S. PATENT DOCUMENTS

| | | | |
|---|---|---|---|
| 5,294,983 A | 3/1994 | Ersoz et al. | |
| 5,299,007 A | 3/1994 | Saeger et al. | |
| 5,414,470 A * | 5/1995 | Hotta et al. | 348/530 |
| 5,557,342 A * | 9/1996 | Eto et al. | 348/706 |
| 6,229,573 B1 | 5/2001 | Sato et al. | |
| 6,487,719 B1 * | 11/2002 | Itoh et al. | 725/17 |
| 6,727,956 B2 * | 4/2004 | Suzuki et al. | 348/524 |
| 7,199,834 B2 * | 4/2007 | Fujii et al. | 348/521 |
| 7,602,444 B2 * | 10/2009 | Cheon et al. | 348/500 |
| 2001/0043417 A1 * | 11/2001 | Watanabe et al. | 360/51 |
| 2005/0007684 A1 * | 1/2005 | Watanabe et al. | 360/51 |

FOREIGN PATENT DOCUMENTS

JP 11-331638 11/1999

\* cited by examiner

*Primary Examiner* — Jefferey Harold
*Assistant Examiner* — Mustafizur Rahman
(74) *Attorney, Agent, or Firm* — Turocy & Watson, LLP

(57) ABSTRACT

A synchronizing signal control circuit includes: a phase detecting section configured to detect a phase difference between a display synchronizing signal and an input synchronizing signal; an adding section configured to add a set value for setting a synchronization compensation period and the detected phase difference; a synchronization phase correcting section configured to correct the phase of the input synchronizing signal on the basis of the output signal of the adding section; a gate signal generating section configured to generate a gate signal representing the synchronization compensation period based on the display synchronizing signal; a synchronization determining section configured to determine whether the synchronization can be effected, by detecting whether the input synchronizing signal exists within the synchronization compensation period; and a selecting section configured to perform switching to the corrected input synchronizing signal on the basis of the determination result of the synchronization determining section.

20 Claims, 3 Drawing Sheets

SYNCHRONIZING SIGNAL CONTROL CIRCUIT AND SYNCHRONIZING SIGNAL CONTROL METHOD

CROSS REFERENCE TO RELATED APPLICATION

This application is based upon and claims the benefit of priority from the prior Japanese Patent Application No. 2008-131292 filed in Japan on May 19, 2008; the entire contents of which are incorporated herein by this reference.

BACKGROUND OF THE INVENTION

1. Field of the Invention

The present invention relates to a synchronizing signal control circuit and a synchronizing signal control method, and more particularly to a synchronizing signal control circuit and a synchronizing signal control method which are configured to detect a phase difference between a display synchronizing signal and an input synchronizing signal and which are configured to instantaneously effect synchronization by performing display synchronizing signal processing in which the phase difference is taken into consideration.

2. Description of Related Art

Conventionally, in a flat panel display (hereinafter referred to as FPD), and the like, a video image is displayed on a display screen on the basis of a digital broadcast signal or a signal from a DVD (Digital Versatile Disc) reproducing apparatus. In such FPD, when a synchronizing signal is disturbed by channel switching, and the like, the video image may not be correctly displayed. For this reason, a synchronizing signal control circuit is proposed in which the change of displayed video images accompanying a switching of synchronizing signals can be smoothly performed within a predetermined time period by correcting the image disturbance at the time of the switching of synchronizing signals (see, for example, Japanese Patent Application Laid-Open Publication No. 11-331638).

In the proposed circuit, the phase of a synchronizing signal of a video signal to be displayed by the switching is made to match with the phase of a synchronizing signal of a currently displayed video signal by comparing the phase of the synchronizing signal of the currently displayed video signal with the phase of the synchronizing signal of the video signal to be displayed by the switching, and thereafter the switching between the video images is performed.

Meanwhile, in the case where a movie source is reproduced by a DVD reproducing apparatus, or the like, the DVD reproducing apparatus outputs a progressive system signal (24P signal) of 24 frames per second. When the 24P signal is displayed on an FPD, the 24P signal is converted into an interlace system signal of 30 frames per second, that is, a signal (60I signal) of 60 fields per second, and thereby the video image is displayed on the display screen. This conversion processing is referred to as 2-3 pull-down conversion processing and performs processing in which four frames of the 24P signal are converted into 10 fields (five frames) of the 60I signal.

However, in the case where a permissible range of the video synchronizing signal is narrow as in the case of the FPD, and the like, there is conventionally a problem that, when an original synchronizing signal of a currently displayed video image is switched to another synchronizing signal of a movie source, and the like, it takes much time to effect synchronization depending on the phase difference between the display synchronizing signal and the input synchronizing signal which are to be synchronized with each other. A free run synchronizing state may be caused during the time period from the setting change of synchronization until the synchronization is actually effected. Thus, there is a problem that, depending on a video image processing method, after the setting of synchronization, a video image is skipped by delay, or a repeating phenomenon of repeating the same video image is caused.

BRIEF SUMMARY OF THE INVENTION

According to an aspect of the present invention, there can be provided a synchronizing signal control circuit including: a phase detecting section configured, when among a plurality of asynchronous video signals, a video display state based on a video signal synchronized with a first synchronizing signal is switched to a video display state based on a video signal synchronized with a second synchronizing signal, to detect a first phase difference between a vertical synchronizing signal of a display synchronizing signal and a vertical synchronizing signal of the second synchronizing signal for each vertical synchronization of the display synchronizing signal; an adding section configured to add a set value for setting a synchronization compensation period and the first phase difference detected in the phase detecting section, to output the addition result; a first synchronization phase correcting section configured to correct the phase of the vertical synchronizing signal of the second synchronizing signal on the basis of the output signal of the adding section to obtain a third synchronizing signal; a gate signal generating section configured to generate a gate signal representing a synchronization compensation period from the output signal of the adding section on the basis of the vertical synchronizing signal of the display synchronizing signal; a synchronization determining section configured, when receiving the gate signal, to determine whether or not the synchronization can be effected, by detecting whether or not the vertical synchronizing signal of the second synchronizing signal exists within the synchronization compensation period; and a selecting section configured to perform switching from the first synchronizing signal to the third synchronizing signal on the basis of the determination result of the synchronization determining section.

DETAILED DESCRIPTION OF THE EMBODIMENTS OF THE INVENTION

In the following, an embodiment according to the present invention will be described in detail with reference to the accompanying drawings.

Figure 1:
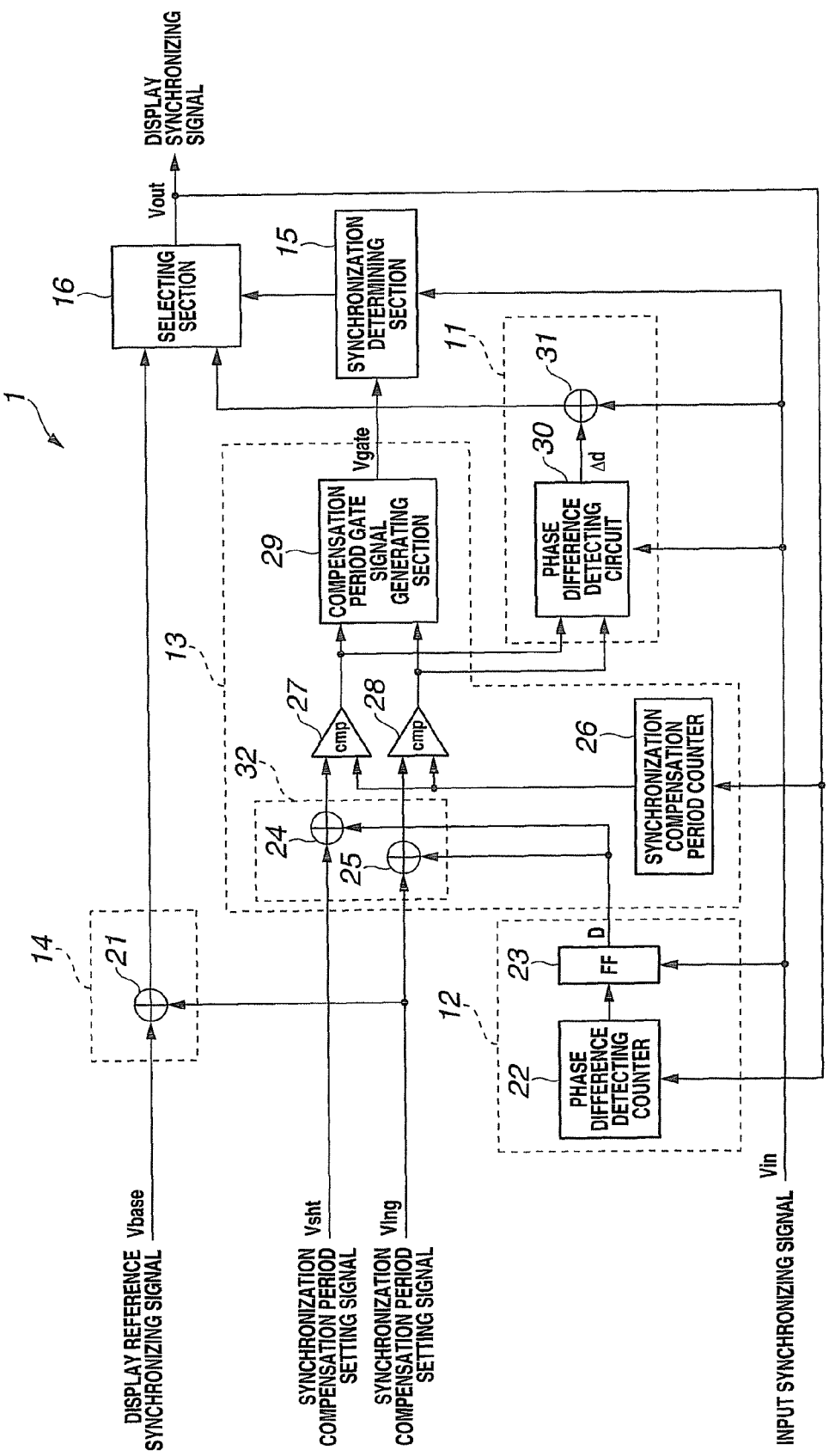
FIG. 1 is a block diagram showing a configuration of a synchronizing signal control circuit according to an embodiment of the present invention.

First, a configuration of a synchronizing signal control circuit according to an embodiment of the present invention will be described with reference to FIG. 1. FIG. 1 is a block diagram showing a configuration of a synchronizing signal control circuit according to an embodiment of the present invention.

As shown in FIG. 1, a synchronizing signal control circuit 1 according to the present embodiment is configured by including a first synchronization phase correcting section 11, a phase detecting section 12, a synchronization compensation period generating section 13, a second synchronization phase correcting section 14, a synchronization determining section 15, and a selecting section 16.

The synchronization phase correcting section 11 is configured by including a phase difference detecting circuit 30 and an adding circuit 31.

The phase detecting section 12 is configured by including a phase difference detecting counter 22, and a flip-flop (hereinafter referred to as FF) 23.

The synchronization compensation period generating section 13 is configured by including adding circuits 24 and 25, a synchronization compensation period counter 26, comparators 27 and 28, and a compensation period gate signal generating section 29.

The synchronization phase correcting section 14 is configured by including an adding circuit 21.

A display reference synchronizing signal Vbase and a synchronization compensation period setting signal Vlng are supplied to the adding circuit 21. The adding circuit 21 adds the display reference synchronizing signal Vbase and the synchronization compensation period setting signal Vlng, so as to correct the phase of the display reference synchronizing signal Vbase to the set value of the synchronization compensation period setting signal Vlng. The adding circuit 21 outputs the corrected signal to the selecting section 16. Note that the adding circuit 21 may also be configured so as to correct the phase of the display reference synchronizing signal Vbase to the set value of a synchronization compensation period setting signal Vsht on the basis of the synchronization compensation period setting signal Vsht.

The phase difference detecting counter 22 is a counter for measuring a phase difference, and is configured to reset a counter value at the timing of a display synchronizing signal Vout. The phase difference detecting counter 22 outputs a measured count value to the FF 23.

The FF 23 holds the count value from the phase difference detecting counter 22 at the timing of an input synchronizing signal Vin, so as to output, as a phase difference D, the count value held at the timing of the input synchronizing signal Vin to the adding circuits 24 and 25.

The synchronization compensation period setting signal Vsht which is a set value for setting the beginning of a synchronization compensation period and the phase difference D from the FF 23 are inputted into the adding circuit 24. The adding circuit 24 adds the phase difference D to the synchronization compensation period setting signal Vsht, and outputs the added signal (Vsht+D) to the comparator 27. On the other hand, the synchronization compensation period setting signal Vlng which is a set value for setting the end of the synchronization compensation period and the phase difference D from the FF 23 are inputted into the adding circuit 25. The adding circuit 25 adds the phase difference D to the synchronization compensation period setting signal Vlng, and outputs the added signal (Vlng+D) to the comparator 28. In this way, the adding circuits 24 and 25 configure an adding section 32 which adds the set value for setting the synchronization compensation period and the phase difference D detected by the phase detecting section 12.

The synchronization compensation period counter 26 is a counter for generating a synchronization compensation period gate signal Vgate, and is configured to reset the counter value at the timing of the display synchronizing signal Vout. The synchronization compensation period counter 26 outputs a measured count value to the comparators 27 and 28.

The comparator 27 compares the signal from the adding circuit 24 with the counter value from the synchronization compensation period counter 26, so as to generate a gate timing signal, and outputs the gate timing signal to the compensation period gate signal generating section 29 and the phase difference detecting circuit 30. On the other hand, the comparator 28 compares the signal from the adding circuit 25 with the counter value from the synchronization compensation period counter 26, so as to generate a gate timing signal, and outputs the gate timing signal to the compensation period gate signal generating section 29 and the phase difference detecting circuit 30.

The compensation period gate signal generating section 29 generates the synchronization compensation period gate signal Vgate for compensating the synchronization compensation period, on the basis of the gate timing signals from the comparators 27 and 28. The compensation period gate signal generating section 29 outputs the generated synchronization compensation period gate signal Vgate to the synchronization determining section 15.

The phase difference detecting circuit 30 detects a phase difference $\Delta d$ on the basis of the gate timing signals from the comparators 27 and 28, and of the input synchronizing signal Vin, so as to output the detected phase difference $\Delta d$ to the adding circuit 31.

The adding circuit 31 adds the phase difference $\Delta d$ to the input synchronizing signal Vin, so as to correct the phase of the input synchronizing signal Vin. The adding circuit 31 outputs the corrected input synchronizing signal to the selecting section 16. In this way, the phase difference detecting circuit 30 and the adding circuit 31 configure the synchronization phase correcting section 11 which corrects the input synchronizing signal.

The synchronization determining section 15 determines whether or not the input synchronizing signal Vin exists within the effective period of the synchronization compensation period gate signal Vgate, so as to output the determination result to the selecting section 16.

The selecting section 16 selects one of the output signal of the adding circuit 21 and the output signal of the adding circuit 31 on the basis of the determination result of the synchronization determining section 15, so as to output the selected output signal as the display synchronizing signal. The selecting section 16 is configured, when the input synchronizing signal Vin exists within the effective period of the synchronization compensation period gate signal Vgate, to select the output signal of the adding circuit 31, and is configured, when the input synchronizing signal Vin does not exist within the effective period of the synchronization compensation period gate signal Vgate, to select the output signal of the adding circuit 21.

Next, the operation of the present embodiment configured as described above will be described.

Figure 2:
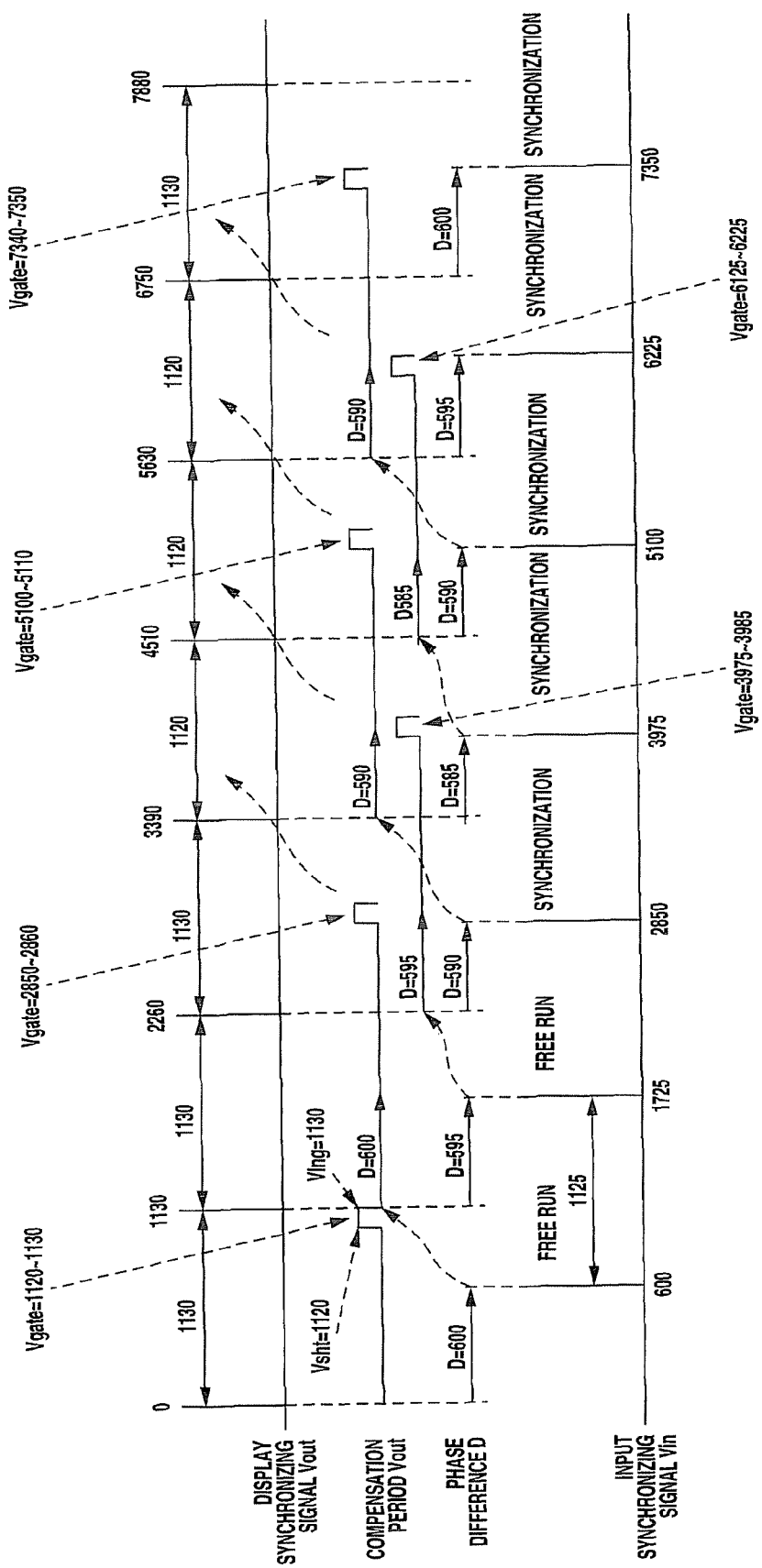
FIG. 2 is a timing chart for explaining an operation of the present embodiment.

FIG. 2 is a timing chart for explaining the operation of the present embodiment. FIG. 2 shows a simplest example in the case where a display synchronizing signal which is a 1125p signal (having 1125 scanning lines and based on a progressive scanning system) and which has a vertical synchronizing frequency of 60 Hz, is made to be synchronized with an input synchronizing signal which is a 1125P signal and has a vertical synchronizing frequency of 60 Hz and which has a phase difference from the phase of the display synchronizing signal. When the display synchronizing signal is made to be synchronized with an input synchronizing signal of the other frequency, a similar operation is performed. In FIG. 2, a description will be given by assuming that the set value of the synchronization compensation period setting signal Vsht is 1120, and that the set value of the synchronization compensation period setting signal Vlng is 1130. The synchronization compensation period setting signals Vsht and Vlng are signals which are used to generate, on the basis of the synchronizing signal of the display synchronizing signal Vout, the synchronization compensation period gate signal Vgate for compensating the synchronization compensation period.

When switching is performed from a video display state based on the display reference synchronizing signal Vbase to a video display state based on the input synchronizing signal Vin, the adding circuit 21 generates a synchronizing signal which is delayed to have the period of the set value of the synchronization compensation period setting signal Vlng, and supplies the generated synchronizing signal to the selecting section 16.

The phase difference detecting counter 22 performs counting from the display synchronizing signal Vout to the next display synchronizing signal Vout, and supplies the count value to the FF 23.

The FF 23 holds the count value at the timing of the input synchronizing signal Vin, and supplies the held count value as the phase difference D to the adding circuits 24 and 25. Thereby, as shown in FIG. 2, the phase difference D between the vertical synchronizing signal of the display synchronizing signal Vout and the vertical synchronizing signal of the input synchronizing signal Vin is detected to be 600.

The adding circuit 24 adds the phase difference D detected as described above to the synchronization compensation period setting signal Vsht, and supplies the addition result to the comparator 27. Similarly, the adding circuit 25 adds the phase difference D to the synchronization compensation period setting signal Vlng, and supplies the addition result to the comparator 28.

The synchronization compensation period counter 26 performs counting from the display synchronizing signal Vout to the next display synchronizing signal Vout, and supplies the count value to the comparators 27 and 28.

The comparator 27 compares the output of the adding circuit 24 with the count value of the synchronization compensation period counter 26, and outputs a gate timing signal to the compensation period gate signal generating section 29 and the phase difference detecting circuit 30.

The comparator 28 compares the output of the adding circuit 25 with the count value of the synchronization compensation period counter 26, and outputs a gate timing signal to the compensation period gate signal generating section 29 and the phase difference detecting circuit 30.

The phase difference detecting circuit 30 sets the phase difference Δd to +|Vlng+D−Vin| in the case where Vsht+D≦Vin≦Vlng+D and where Vin≦Vlng+D, so as to output the set phase difference to the adding circuit 31. The phase difference detecting circuit 30 sets the phase difference Δd to −|Vsht+D−Vin| in the case where Vsht+D≦Vin≦Vlng+D and where Vsht+D≦Vin, so as to output the set phase difference to the adding circuit 31.

The adding circuit 31 adds the detected phase difference Δd to the vertical synchronizing signal of the input synchronizing signal Vin, and supplies the phase-corrected input synchronizing signal Vin to the selecting section 16.

The compensation period gate signal generating section 29 generates, from the outputs of the comparators 27 and 28, the synchronization compensation period gate signal Vgate based on the vertical synchronization signal of the display synchronizing signal Vout, and outputs the generated synchronization compensation period gate signal Vgate to the synchronization determining section 15.

The synchronization determining section 15 detects whether or not the vertical synchronizing signal of the input synchronizing signal Vin exists within the period of the synchronization compensation period gate signal Vgate, and supplies the detection result to the selecting section 16. That is, the synchronization determining section 15 detects whether or not the formula (Vsht+D≦Vin≦Vlng+D) is established.

The selecting section 16 selects one of the output of the adding circuit 21 and the output of the adding circuit 31 on the basis of the selection result. When the vertical synchronizing signal of the input synchronizing signal Vin exists within the effective period of the synchronization compensation period gate signal Vgate (Vsht+D≦Vin≦Vlng+D), the output of the adding circuit 31 is selected. When the vertical synchronizing signal of the input synchronizing signal Vin does not exist within the effective period of the synchronization compensation period gate signal Vgate (Vsht>Vin or Vin>Vlng), the output of the adding circuit 21 is selected.

In the case of Vsht+D≦Vin≦Vlng+D, the synchronization is effected, and hence the period of the next display synchronizing signal Vout becomes a value obtained by adding the phase difference Δd to the period of the input synchronizing signal Vin. On the other hand, in the case of Vsht>Vin or Vin>Vlng, a free-run operation of the display synchronizing signal Vout is performed at the period of the set value of the synchronization compensation period setting signal Vlng. That is, when it is determined that the synchronization cannot be effected, the display reference synchronizing signal Vbase is corrected to the set value of the synchronization compensation period setting signal Vlng in order to make the phase of the display synchronizing signal Vout quickly close to the phase of the input synchronizing signal Vin.

Figure 3:
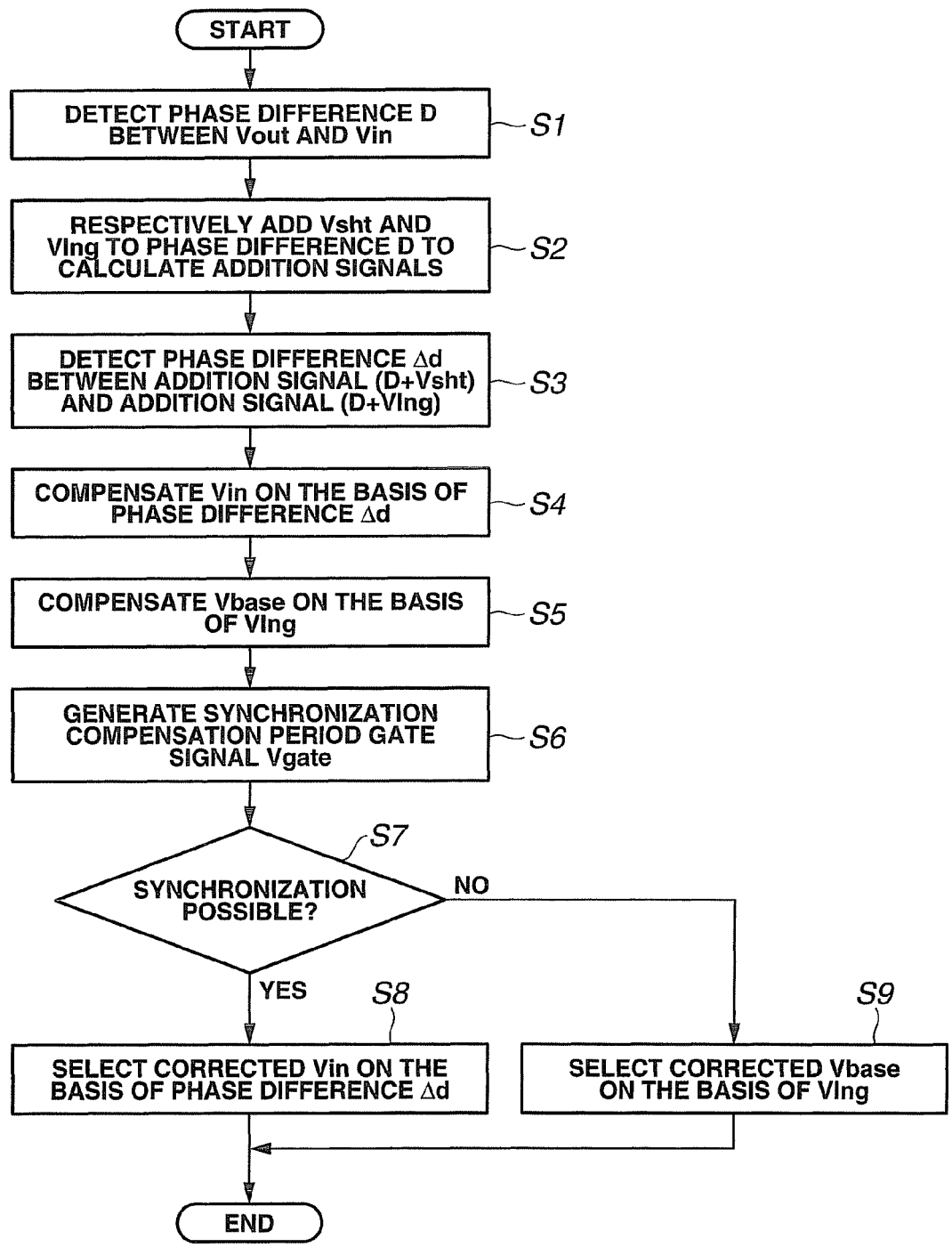
FIG. 3 is a flow chart for explaining an example of a flow of synchronizing signal processing.

FIG. 3 is a flow chart for explaining an example of a synchronizing signal process flow.

First, the phase difference D between the display synchronizing signal Vout and the input synchronizing signal Vin is detected (step S1). The synchronization compensation period setting signals Vsht and Vlng are respectively added to the phase difference D, so that the addition signal (D+Vsht) and the addition signal (D+Vlng) are calculated (step S2). The phase difference Δd between the addition signal (D+Vsht) and the addition signal (D+Vlng) is detected (step S3), so that the input synchronizing signal Vin is corrected on the basis of the phase difference Δd (step S4). Next, the display reference synchronizing signal Vbase is corrected on the basis of the synchronization compensation period setting signal Vlng (step S5). On the basis of the addition signal (D+Vsht) and the addition signal (D+Vlng), the synchronization compensation period gate signal Vgate is generated (step S6). On the basis of the synchronization compensation period gate signal Vgate, it is determined whether or not the synchronization can be effected (step S7). When it is determined that the synchronization can be effected, the determination result becomes YES, so that the input synchronizing signal Vin corrected on the basis of the phase difference Δd is selected (step S8) and the processing is completed. On the other hand, when it is determined that the synchronization cannot be effected, the determination result becomes NO, so that the display reference synchronizing signal Vbase corrected on the basis of the synchronization compensation period setting signal Vlng is selected (step S9) and the processing is completed.

As described above, the synchronizing signal control circuit 1 generates the synchronization compensation period gate signal Vgate on the basis of the phase difference between the display synchronizing signal Vout and the input synchronizing signal Vin, and detects whether or not the input synchronizing signal Vin exists within the effective period of the synchronization compensation period gate signal Vgate. When the input synchronizing signal Vin exists within the effective period of the synchronization compensation period gate signal Vgate, the synchronizing signal control circuit 1 effects the synchronization by outputting the phase adjusted input synchronizing signal Vin as the display synchronizing signal Vout. As a result, the synchronizing signal control circuit 1 is able to instantaneously effect the synchronization. Further, the synchronization is instantaneously effected, so as to thereby prevent the degradation in the video quality, such as the skipping and repeating of a video image which are caused after display of the video image.

Therefore, according to the synchronizing signal control circuit of the present embodiment, the skipping and repeating of a video image can be prevented in such a manner that synchronization is instantaneously effected by detecting a phase difference between a display synchronizing signal and an input synchronizing signal and by performing display synchronizing signal processing in which the phase difference is taken into consideration.

Note that the respective steps in the flow chart in the specification may be executed in such a manner that the respective steps are executed on the basis of a changed execution sequence, that the plurality of steps are simultaneously executed in parallel, or that the execution sequence of the steps is changed each time the steps of the procedure are executed, unless the execution sequence of the steps is contrary to the feature of the specification.

The present invention is not limited to the above described embodiment, and various modification, changes or the like, are possible within the scope and spirit of the invention.

What is claimed is:

1. A synchronizing signal control circuit comprising:
   a phase detecting section configured, when among a plurality of asynchronous video signals, a video display state based on a video signal synchronized with a first synchronizing signal is switched to a video display state based on a video signal synchronized with a second synchronizing signal, to detect a first phase difference between a vertical synchronizing signal of a display synchronizing signal and a vertical synchronizing signal of the second synchronizing signal for each vertical synchronization of the display synchronizing signal;
   an adding section configured to add a set value for setting a synchronization compensation period and the first phase difference detected in the phase detecting section to output the addition result;
   a first synchronization phase correcting section configured to correct the phase of the vertical synchronizing signal of the second synchronizing signal on the basis of the output signal of the adding section to obtain a third synchronizing signal;
   a gate signal generating section configured to generate a gate signal representing a synchronization compensation period from the output signal of the adding section on the basis of the vertical synchronizing signal of the display synchronizing signal;
   a synchronization determining section configured, when receiving the gate signal, to determine whether or not the synchronization can be effected, by detecting whether or not the vertical synchronizing signal of the second synchronizing signal exists within the synchronization compensation period; and
   a selecting section configured to perform switching from the first synchronizing signal to the third synchronizing signal on the basis of the determination result of the synchronization determining section.

2. The synchronizing signal control circuit according to claim 1,
   wherein the set value for setting the synchronization compensation period is configured by a first set value for setting the beginning of the synchronization compensation period and a second set value for setting the end of the synchronization compensation period,
   wherein the adding section includes a first adding circuit configured to add the first set value and the first phase difference, and a second adding circuit configured to add the second set value and the first phase difference, and
   wherein the gate signal generating section generates the gate signal on the basis of addition results of the first and second adding circuits.

3. The synchronizing signal control circuit according to claim 2, further comprising
   a second synchronization phase correcting section configured to correct the phase of the vertical synchronizing signal of the display synchronizing signal on the basis of the second set value to obtain a fourth synchronizing signal,
   wherein the selecting section is configured, when it is determined by the synchronization determining section that synchronization can be effected, to select the third synchronizing signal corrected by the first synchronization phase correcting section, and is configured, when it is determined by the synchronization determining section that synchronization cannot be effected, to select the fourth synchronizing signal corrected by the second synchronization phase correcting section.

4. The synchronizing signal control circuit according to claim 3,
   wherein the second synchronization phase correcting section corrects the phase of the vertical synchronizing signal of the display synchronizing signal on the basis of the first set value in place of the second set value to obtain the fourth synchronizing signal.

5. The synchronizing signal control circuit according to claim 3,
   wherein the second synchronization phase correcting section is a forth adding circuit configured to obtain the fourth synchronizing signal by adding the display synchronizing signal and the second set value.

6. The synchronizing signal control circuit according to claim 5,
   wherein the fourth adding circuit is configured to obtain the fourth synchronizing signal by adding the display synchronizing signal and the first set value.

7. The synchronizing signal control circuit according to claim 2, further comprising
   a synchronization compensation period counter configured to count a value from the display synchronizing signal to the next display synchronizing signal in order to obtain a reference of the vertical synchronizing signal.

8. The synchronizing signal control circuit according to claim 7,
   wherein the synchronization compensation period counter is configured to reset the counted value on the basis of the display synchronizing signal.

9. The synchronizing signal control circuit according to claim 7, further comprising:
   a first comparator configured to generate a first gate timing signal representing the start timing of the synchronization compensation period by comparing the count value counted by the synchronization compensation period counter with the addition result of the first adding circuit; and a second comparator configured to generate a second gate timing signal representing the end timing of the synchronization compensation period by comparing the count value counted by the synchronization compensation period counter with the addition result of the second adding circuit.

10. The synchronizing signal control circuit according to claim 1,
wherein the first synchronization phase correcting section is configured to obtain the third synchronizing signal by adding, to the phase of the vertical synchronizing signal of the second synchronizing signal, the second phase difference obtained on the basis of the phase of the vertical synchronizing signal of the second synchronizing signal and the output signal of the adding section.

11. The synchronizing signal control circuit according to claim 10,
wherein the first synchronization phase correcting section includes a phase difference detecting circuit configured to detect the second phase difference on the basis of the phase of the vertical synchronizing signal of the second synchronizing signal and the output signal of the adding section.

12. The synchronizing signal control circuit according to claim 11,
wherein the first synchronization phase correcting section includes a third adding circuit configured to obtain the third synchronizing signal by adding the second phase difference obtained by the phase difference detecting circuit to the phase of the vertical synchronizing signal of the second synchronizing signal.

13. The synchronizing signal control circuit according to claim 1,
wherein the phase detecting section includes a phase difference detecting counter configured to count a value from the display synchronizing signal to the next display synchronizing signal, in order to detect the first phase difference.

14. The synchronizing signal control circuit according to claim 13,
wherein the phase difference detecting counter is configured to reset the counted value on the basis of the display synchronizing signal.

15. The synchronizing signal control circuit according to claim 13,
wherein the phase detecting section includes a flip-flop configured to receive the count value counted by the phase difference detecting counter, to output the received count value as the first phase difference.

16. The synchronizing signal control circuit according to claim 15,
wherein the flip-flop receives the count value counted by the phase difference detecting counter on the basis of the second synchronizing signal.

17. A synchronizing signal control method comprising:
detecting, when among a plurality of asynchronous video signals, a video display state based on a video signal synchronized with a first synchronizing signal is switched to a video display state based on a video signal synchronized with a second synchronizing signal, a first phase difference between a vertical synchronizing signal of a display synchronizing signal and a vertical synchronizing signal of the second synchronizing signal for each vertical synchronization of the display synchronizing signal;

outputting an addition signal obtained by adding a set value for setting a synchronization compensation period and the detected first phase difference;

obtaining a third synchronizing signal by correcting the phase of the vertical synchronizing signal of the second synchronizing signal on the basis of the addition signal;

generating a gate signal representing a synchronization compensation period from the addition signal on the basis of the vertical synchronizing signal of the display synchronizing signal;

determining, when receiving the gate signal, whether or not the synchronization can be effected, by detecting whether or not the vertical synchronizing signal of the second synchronizing signal exists within the synchronization compensation period; and switching from the first synchronizing signal to the third synchronizing signal on the basis of the determination result.

18. The synchronizing signal control method according to claim 17,
wherein the set value for setting the synchronization compensation period is configured by a first set value for setting the beginning of the synchronization compensation period and a second set value for setting the end of the synchronization compensation period,
wherein the addition signal is configured by a first addition signal obtained by adding the first set value and the first phase difference, and a second addition signal obtained by adding the second set value and the first phase difference, and
wherein the gate signal generating section is configured to generate the gate signal on the basis of the first and second addition signals.

19. The synchronizing signal control method according to claim 18, further comprising:
obtaining a fourth synchronizing signal by correcting the phase of the vertical synchronizing signal of the display synchronizing signal on the basis of the second set value; and
selecting, when it is determined that synchronization can be effected, the corrected third synchronizing signal, and selecting, when it is determined that synchronization cannot be effected, the corrected fourth synchronizing signal.

20. The synchronizing signal control method according to claim 19, further comprising
obtaining the fourth synchronizing signal by correcting the phase of the vertical synchronizing signal of the display synchronizing signal on the basis of the first set value in place of the second set value.

* * * * *